United States Patent
Pitonak et al.

(10) Patent No.: US 7,968,218 B2
(45) Date of Patent: Jun. 28, 2011

(54) METAL CARBONITRIDE LAYER AND METHOD FOR THE PRODUCTION THEREOF

(75) Inventors: Reinhard Pitonak, Bruck/Mur (AT); Jose Garcia, Vienna (AT); Ronald Weissenbacher, Bruck/Mur (AT); Klaus Ruetz-Udier, Graz (AT)

(73) Assignee: Boehlerit GmbH & Co. K.G., Kapfenberg (AT)

(*) Notice: Subject to any disclaimer, the term of this patent is extended or adjusted under 35 U.S.C. 154(b) by 243 days.

(21) Appl. No.: 11/991,635

(22) PCT Filed: Nov. 16, 2006

(86) PCT No.: PCT/AT2006/000469
§ 371 (c)(1),
(2), (4) Date: Mar. 7, 2008

(87) PCT Pub. No.: WO2007/056785
PCT Pub. Date: May 24, 2007

(65) Prior Publication Data
US 2009/0226758 A1    Sep. 10, 2009

(30) Foreign Application Priority Data

Nov. 17, 2005 (AT) ................ A 1876/2005
Sep. 22, 2006 (AT) ................ A 1585/2006

(51) Int. Cl.
*B32B 9/04* (2006.01)
*C23C 16/00* (2006.01)

(52) U.S. Cl. ........ 428/704; 428/698; 428/701; 428/702; 427/249.17; 427/249.18; 427/249.19; 427/255.23; 427/255.28; 427/255.391

(58) Field of Classification Search .............. 428/698, 428/701, 702, 704; 427/249.17, 249.18, 427/249.19, 255.23, 255.28, 255.391
See application file for complete search history.

(56) References Cited

U.S. PATENT DOCUMENTS

| | | | |
|---|---|---|---|
| 5,436,071 | A | 7/1995 | Odani et al. |
| 5,589,223 | A | 12/1996 | Odani et al. |
| 5,665,431 | A | 9/1997 | Narasimhan |
| 6,056,999 | A | 5/2000 | Narasimhan |
| 6,146,697 | A | 11/2000 | Undercoffer |

(Continued)

FOREIGN PATENT DOCUMENTS

EP    0 440 157    8/1991

(Continued)

OTHER PUBLICATIONS

English-language abstract of Japanese Patent No. JP 10-323724.

(Continued)

*Primary Examiner* — Gwendolyn Blackwell
(74) *Attorney, Agent, or Firm* — Greenblum & Bernstein, P.L.C.

(57) ABSTRACT

A method for coating a tool or tool part, includes providing a base structure of the tool or the tool part at a temperature of 850° C. to 950° C. and applying at least one layer to the base structure. One or more layers of the at least one layer is formed of a metal carbonitride of composed of at least one of titanium, zirconium, hafnium, vanadium, niobium, tantalum and chromium. The one or more layers of the at least one layer is deposited by a deposition of a gas containing methane, nitrogen and at least one metal compound. After beginning the applying, the temperature is increased by at least 40° C. to an increased temperature and the deposition is continued for a time at the increased temperature.

27 Claims, 3 Drawing Sheets

U.S. PATENT DOCUMENTS

| | | |
|---|---|---|
| 6,338,894 B1 | 1/2002 | Hirakawa et al. |
| 7,081,186 B2 * | 7/2006 | Ehiasarian et al. ...... 204/192.12 |
| 2002/0102403 A1 | 8/2002 | Leverenz et al. |
| 2003/0143384 A1 | 7/2003 | Ruppi et al. |
| 2005/0075708 A1 | 4/2005 | O'Brien et al. |
| 2005/0109607 A1 | 5/2005 | Ehiasarian et al. |
| 2008/0160338 A1 * | 7/2008 | Tanibuchi et al. ............ 428/627 |

FOREIGN PATENT DOCUMENTS

| | | |
|---|---|---|
| EP | 0 530 779 | 3/1993 |
| EP | 1 160 353 | 12/2001 |
| EP | 1 736 307 | 12/2006 |
| JP | 08-188846 | 7/1996 |
| JP | 10-315011 | 12/1998 |
| JP | 10-323724 | 12/1998 |
| WO | 2005/092608 | 10/2005 |

OTHER PUBLICATIONS

English-language abstract of Japanese Patent No. JP 10-315011.

English-language abstract of Japanese Patent No. JP 08-188846.

* cited by examiner

METAL CARBONITRIDE LAYER AND METHOD FOR THE PRODUCTION THEREOF

CROSS REFERENCE TO RELATED APPLICATIONS

The present application is a U.S. National Stage Application of International Application No. PCT/AT2006/000469 filed Nov. 16, 2006, which published as WO 2007/056785 A1 May 24, 2007, the disclosure of which is expressly incorporated by reference herein in its entirety. Further, the present application claims priority under 35 U.S.C. §119 and §365 of Austrian Application No. A 1876/2005 filed Nov. 17, 2005 and Austrian Application No. A 1585/2006 filed Sep. 22, 2006.

BACKGROUND OF THE INVENTION

1. Field of the Invention

The invention relates to a method for coating a tool or tool part, in particular a cutting element such as an insert, in which a base structure is provided and one or more layers are applied thereto, at least one layer being formed of a metal carbonitride of one or more of the metals titanium, zirconium, hafnium, vanadium, niobium, tantalum and/or chromium and being deposited by a gas containing methane, nitrogen and one or more metal compounds.

Furthermore, the invention relates to a coating applied to an object with at least one metal carbonitride layer of one or more of the metals titanium, zirconium, hafnium, vanadium, niobium, tantalum and/or chromium, e.g., a titanium carbonitride layer.

Furthermore, the invention relates to a tool or tool part, in particular a cutting element such as an insert, comprising a base structure with one or more layers applied thereto, at least one layer being a metal carbonitride layer.

2. Discussion of Background Information

Abrasively highly stressed tools, e.g., cutting, stamping or forming tools, are usually coated in order to counteract wear of the tools during use. Multilayer coatings with an outermost workpiece-side working layer and several layers or plies lying underneath are also thereby often used. Although multilayer coatings are more complex to produce than single-layer coatings, with the same thickness the multilayer coatings are less brittle and connected with greater flexibility when it is a matter of designing a coating in the best possible manner with respect to anticipated stresses.

From the prior art, multilayer coatings are known for inserts of lathe tools, which coatings have a titanium nitride layer or aluminum oxide layer as the outermost layer on the workpiece side during use, which layer is deposited directly or indirectly on a metal carbonitride layer such as a titanium carbonitride layer. The aluminum oxide layer, for example, is chemically inert and heat-resistant and thus protects the layers lying underneath. The supporting titanium carbonitride layer is characterized by great hardness and is intended to contribute to a wear resistance of the coating or of the tool. Further layers, in particular layers that adhere well to the base structure, can be provided between the connecting layer of titanium carbonitride and the base structure of the insert of hard metal, thus rendering possible a strong adhesive connection of the coating.

It must be taken into account with multilayer coatings that a great hardness of individual layers alone is not yet sufficient for a long operational life or service life. Even an extremely hard layer can no longer be useful if it detaches from the base structure or a layer lying underneath, which can occur in particular with inserts, which are subjected not only to high mechanical stresses, but also to high temperatures and/or temperature changes.

Particularly high demands are made on connecting layers or intermediate layers of metal carbonitride ($MeC_xN_y$) in this context, since their very function is to give the coating wear resistance and to bear a protecting working layer for a long time.

In particular, layers of titanium carbonitride are particularly frequently used as connecting layers in multilayer coatings or layer systems. The reason for this is that with known titanium carbonitride layers, carbon can be replaced consistently by nitrogen (or vice versa), whereby the properties of these layers can also be variably adjusted via the composition. Finally, layers of this type have properties that lie or can be set between those of titanium carbide and titanium nitride.

A production of titanium carbonitride layers can be carried out by CVD methods (chemical vapor deposition), as was the practice for many years. With CVD, the layers are deposited from a gas mixture containing methane, nitrogen, titanium tetrachloride and hydrogen as carrier gas at substrate temperatures from 950 to 1100° C. The titanium carbonitride layers thus obtained are composed of globular grain and form a dense layer.

In connection with the deposition of this so-called high-temperature titanium carbonitride on hard metal substrates, an undesirable decarburization of the substrate is often observed, even when a connecting layer, e.g., an 0.5 µm thick layer of titanium nitride, is provided between the hard metal and the titanium carbonitride layer. In order to curb this decarburization, there has recently been a switch to using gases containing titanium tetrachloride and acetonitrile for the deposition of titanium carbonitride, whereby a deposition temperature can be reduced to lower temperatures of 750 to 900° C. Titanium carbonitride produced in this manner is known as medium-temperature titanium carbonitride and has a columnar structure of rod-shaped crystallites, the thickness of which is more than 750 Å or 75 nanometers.

As mentioned, known high-temperature or medium-temperature titanium carbonitride layers are used primarily as connecting layers, on which further layers are or will be deposited. However, it has been shown that an adhesive strength of titanium nitride layers or other types of working layers can be insufficient on conventional titanium carbonitride layers as on other metal carbonitride layers, too, so that an operational life of the tool can be limited by a detaching of a working layer that is wear resistant per se.

In addition, known titanium carbonitride layers, and metal carbonitride layers in general, are also used as outermost layer arranged on the workpiece side, thus as a working layer. However, in practice they can thereby be used only in a very restricted manner: with layers of this type, when used as a working layer, despite great hardness, sticking and thus, a comparatively short service life, is to be anticipated.

SUMMARY OF THE INVENTION

Starting from this basis, the aim of the invention is to disclose a method of the type mentioned at the outset, with which a metal carbonitride layer can be applied, on which, on the one hand, further layers with high adhesive strength can be deposited and which, on the other hand, is highly wear-resistant, so that the coated tool or tool part optionally can be used immediately.

The aim of the invention is also to disclose a coating of the type mentioned at the outset applied to an object, which coating has at least one metal carbonitride layer, e.g., titanium carbonitride layer, on which, on the one hand, further layers with high adhesive strength are deposited and which, on the other hand, is highly wear-resistant such that the coated tool or tool part optionally can be used immediately.

Furthermore, an aim of the invention is to create a tool or tool part of the type mentioned at the outset in which the metal carbonitride layer is highly wear-resistant and ensures a high adhesive strength of a layer optionally deposited thereon.

The method-related aim of the invention is attained by a method that includes providing a base structure and applying one or more layers thereto, at least one layer being formed of a metal carbonitride of one or more of the metals titanium, zirconium, hafnium, vanadium, niobium, tantalum and/or chromium and being deposited by a gas containing methane, nitrogen and one or more metal compounds, characterized in that the deposition of the layer of metal carbonitride is begun at a temperature of the base structure of 850 to 950° C., after which the temperature of the base structure is increased by at least 40° C. and the deposition is continued at least for a time at increased temperature. Favorable variants of a method according to the invention are the subject matter of the method dependent claims.

The advantages obtained with the invention are particularly that a metal carbonitride layer, e.g., a titanium carbonitride layer, is generated with a microscopic structure that is excellently suitable for the deposition of further layers with strong adhesion. In terms of crystal chemistry, the crystals respectively have an inhomogeneous element distribution over the cross section. The layers of, e.g., titanium nitride, aluminum oxide or diamond, subsequently applied, adhere to such layers in a much improved manner and separation does not occur even under the harshest operating conditions or occurs only with much reduced intensity.

It was also unexpectedly determined that a layer deposited according to the invention also exhibits excellent wear behavior compared to conventional metal carbonitride layers and therefore can also be used advantageously as a working layer. This observation is all the more surprising if one considers that especially a titanium carbonitride layer deposited according to the invention has a lower hardness (or microhardness) with the same chemical composition than a titanium carbonitride layer with granular structure produced in a conventional way.

In carrying out the method according to the invention, it is advantageous if the temperature of the base structure is increased with progressive deposition. An uninterrupted growth of the metal carbonitride layer is thus given, which proves to be favorable with respect to a layer structure free from defects as far as possible.

In order to avoid a metal nitride layer beginning to form in some areas after initial formation of metal nitride nuclei, it is expedient for the temperature of the base structure to be brought to an increased temperature within 350 minutes, in particular 120 minutes, after the start of deposition.

It is advantageous for a high stressability of the deposited metal carbonitride layer if the deposition is continued for at least 60 minutes after increased temperature has been reached, so that a minimum layer thickness of at least 0.5 μm is set.

An increased temperature is preferably 1010 to 1040° C. In this temperature range the individual crystals grow quickly and with few defects, so that a rapid growth of a highly stressable layer results.

Particularly excellent coatings with respect to the wearing qualities of the tool or tool part can be obtained if a titanium carbonitride layer is formed and deposited by a gas containing methane, nitrogen and titanium tetrachloride. In this connection, it has proven of value for the gas to contain methane, nitrogen and hydrogen in a molar ratio of 1:(8 to 11):(15 to 25) and the gas to contain 1 to 8% by volume titanium tetrachloride. Undesirable proportions of granular titanium carbonitride can thus be substantially reduced or avoided and the advantages achieved according to the invention increased still further. A composition of the layer in this case is $TiC_xN_y$ with x being 0.15 to 0.25 and y being 0.85 to 0.75.

A pressure of the reactive gas is not critical per se and can be varied within broad limits. The titanium carbonitride layer is preferably deposited at a pressure of 100 to 800 millibar, preferably 200 to 400 millibar.

The further aim of the invention of disclosing a coating, applied to an object, with at least one metal carbonitride layer of one or more of the metals titanium, zirconium, hafnium, vanadium, niobium, tantalum and/or chromium, e.g., a titanium carbonitride layer, which is highly wear-resistant, and on which, optionally, further layers with high adhesive strength can be deposited, is attained if the metal carbonitride layer has a nanocomposite structure that is formed from crystals with inhomogeneous element distribution.

The advantages achieved with the invention are in particular that a metal carbonitride layer with nanocomposite structure, e.g., a titanium carbonitride layer of this type, with a microscopic structure is available, which is excellently suitable for the deposition of further layers with strong adhesion.

One skilled in the art understands a nanocomposite structure of the layer to describe an embodiment with several phases that have a measurement in the nano range.

Surprisingly, tests have shown that there is essentially no decarburization at all in the near-surface area of the substrate and that no indiffusion of the binder phase in the metal carbonitride layer occurred, either.

The composite structure with a plurality of individual crystals in the nano size range also yields a substantially enlarged grain boundary area, whereby the toughness of the layer is increased.

Since the metal carbonitride crystals have grown in the nano size range during coating, the surface is fissured and, during the deposition of a further layer, offers structurally quasi a plurality of small individual points or spikes, which are advantageous for a multiple anchoring. The layers, e.g., of titanium nitride, aluminum oxide or diamond, which may be subsequently applied, therefore adhere in a much improved manner and a separation does not occur even under the harshest operating conditions or occurs only with much reduced intensity.

It was also unexpectedly determined that a layer deposited according to the invention also exhibits an excellent wear behavior compared to conventional metal carbonitride layers and can therefore also be used advantageously as a working layer. This observation is all the more surprising if one considers that especially a titanium carbonitride layer deposited according to the invention has a lower hardness (or microhardness) with the same chemical composition than a titanium carbonitride layer with granular structure produced in a conventional way.

According to a preferred embodiment, a layer can be produced with particularly good wear properties if the crystals have different contents of carbon and of nitrogen in their chemical composition in the center and in the marginal area.

The toughness and adhesive strength of the metal carbonitride layer can be further increased if at least two types of crystals with different geometric shape form the layer.

The strength and toughness of the metal carbonitride layer itself as well as a connection with a grown layer, e.g., a titanium nitride or aluminum oxide layer, can be increased if the layer is formed from at least one type with star-shaped acicular structure and at least one type with lamellar structure.

In one embodiment variant the layer of metal carbonitride can be doped with boron, silicon, zirconium, hafnium, vanadium or rare earth elements in order, for example, to increase a hot hardness of the layer. Doped in this context signifies individual contents up to 0.01% by weight, based on the total weight of the layer.

It is particularly advantageous if rod-shaped crystallites in the arithmetic average have a thickness of less than 65 nanometers, preferably less than 45 nanometers. According to an aspect of the invention, the finer the crystallites, the better the action of an anchoring effect in the deposition of a layer on the metal carbonitride layer, and the greater the adhesion of the layer additionally deposited.

According to a preferred embodiment of the invention, the average size of the crystals increases towards the outside, i.e., the workpiece side. In this manner, on the one hand, a high anchoring quality of the metal carbonitride layer on an area lying beneath, for example, on a hard metal cutting insert of a tool, is achieved. On the other hand, even without further layers a long working life of the part can be advantageously achieved.

According to the invention, a metal carbonitride layer of one or more of the metals titanium, zirconium, hafnium, vanadium, niobium, tantalum and/or chromium, for example, a titanium carbonitride layer, which is highly wear-resistant and on which optionally further layers with high adhesive strength are deposited, has a composition $MeC_xN_y$, with x being 0.1 to less than 0.3 and y being 0.9 to more than 0.7.

Since titanium nitride has a much lower hardness compared to titanium carbide, it was surprising to one skilled in the art that a titanium carbonitride according to the invention with a carbon content of less than 0.3 on average forms a highly wear-resistant layer and a coated tool can be used directly in a practical manner, e.g., in a cutting of metal material, with a high service life.

It is unexpected, particularly for a titanium carbonitride layer, that a microhardness of a layer according to the invention is only approximately 2000 $H_v$ and is thus considerably lower than those conventional titanium carbonitride layers which (with increasing carbon content) can be 2300 to 3400 $H_v$. It is also surprising in this context that despite marked carbon content in the layer, sticking is greatly reduced, which has a positive effect on the wear behavior.

The wearing quality of the coating can thereby have a maximum level when the values are x=0.15 to 0.20 and y=0.85 to 0.80.

A metal carbonitride layer according to the invention is optically characterized in that the color of the layer is a yellowish red shade with a light/dark structure, in particular with the like vein structure, which is also discernible at 500-1000× magnification in the micrograph in the optical microscope.

The further aim of the invention to create a tool or tool part of the type mentioned at the outset with applied coating, with which the metal carbonitride layer is very strongly anchored and wear-resistant and ensures a high adhesive strength of a layer optionally deposited thereon, is achieved in that the metal carbonitride layer is a coating applied. Advantageously, the carbonitride layer is formed on the outside, i.e., on the workpiece side, in a star-shaped acicular manner and bears a top layer, formed as an oxide layer, preferably an aluminum oxide layer ($Al_2O_3$) or a carbon layer, in particular a diamond layer.

Advantages of a tool or tool part according to the invention are in particular that the metal carbonitride layer provided on the one hand is more wear-resistant than conventional metal carbonitride layers and on the other hand, when another layer is deposited on the metal carbonitride layer, links and anchors it strongly, which likewise proves advantageous for an operational life of the tool or tool part.

Although different layers can be applied, e.g., as working layers, to the metal carbonitride layer with a tool according to the invention, a particularly strong adhesion is observed when a layer of titanium aluminum nitride is applied. Layers of aluminum oxide, $Al_2O_3$, or diamond can also be applied with particularly good adhesive strength to a metal carbonitride layer according to the invention, in particular a titanium carbonitride layer.

BRIEF DESCRIPTION OF THE DRAWINGS

Further advantages and favorable effects of a tool according to the invention result from the context of the specification and the following exemplary embodiments of the figures, based on which the invention is described in still more detail. They show.

DETAILED DESCRIPTION OF THE INVENTION

Figure 1:
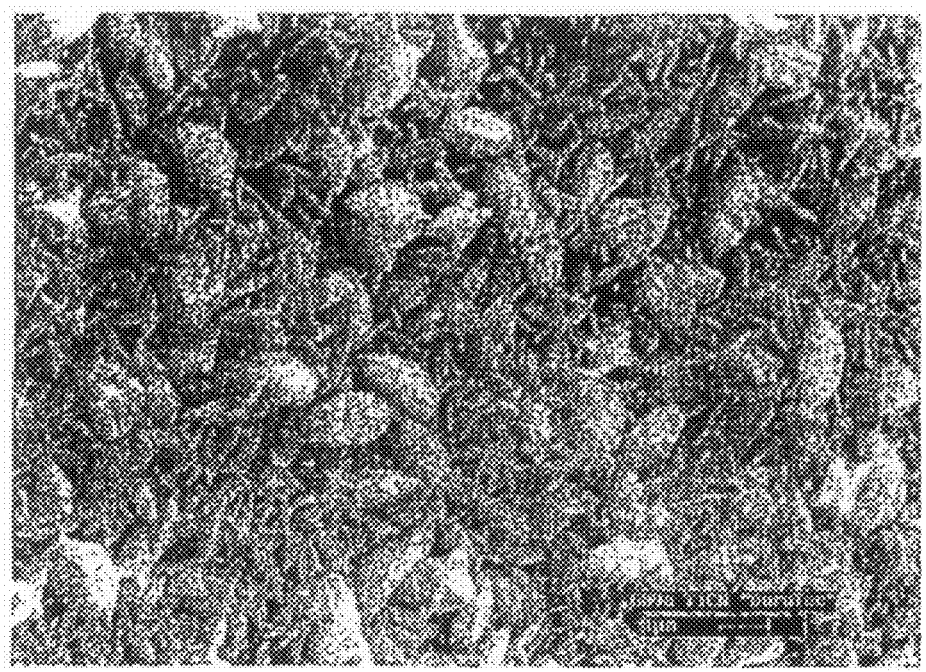
FIG. 1: An SEM photo of the surface of a Ti(CN) layer according to the invention (SEM—Scanning Electron Microscopy)

FIG. 1 shows an SEM image of the surface of a titanium carbonitride layer according to the invention. The layer has been grown on the substrate in a composite structure with star-shaped needles and thicker lamina embedded therein. The lamina have a largest longitudinal extension of approximately 1 μm, are flat and have a width on average of approximately 0.7 μm. However, the star-shaped needles are embodied with a much smaller thickness. The lamellar and acicular crystals have an inhomogeneous element distribution and also have different average composition in comparison.

The formation of a surface of a metal carbonitride layer structured in this manner provides the best conditions for a high adhesive strength of an applied subsequent layer.

Tests by x-ray diffraction (XRD) using CuK radiation were used to identify the crystalline phases in the layer. Evaluations of the XRD measurements yielded a carbon/nitride (C/N) ratio in the range of C/N=0.14 to 0.19/0.86 to 0.81 with a layer according to the invention.

An average grain size determined according to Scherrer yielded values of 26 and 17 nm. Thus, the layer has a nanostructure.

Figure 2:
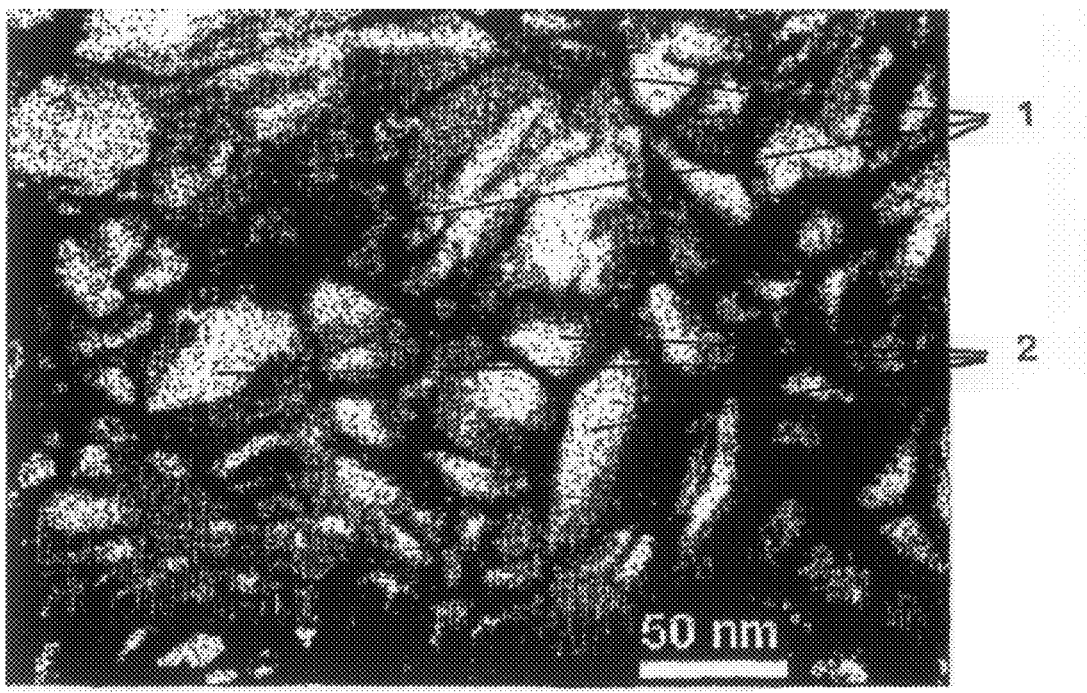
FIG. 2: Image of a TEM test (TEM—Transmission Electron Microscopy)

Dark areas labeled 1 and light areas labeled 2 are discernible from FIG. 2 of a TEM image. In the tests of this sample, in comparison, the dark areas are richer in carbon and the lighter areas are richer in nitrogen. A demixing with respect to the composition of the grains can thus be clearly seen, which reveals a specific core/sheath structure of the grains.

Figure 3:
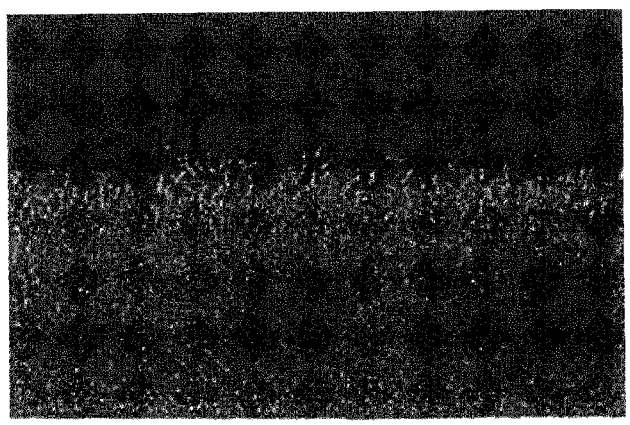
FIG. 3: A micrograph of the transition of a coating (microsection ground at an angle of 15°)

The free surface of a titanium carbonitride layer according to the invention is embodied in a markedly fissured and acicular manner at the transition to a working layer, which may be subsequently deposited (FIG. 3). This surface structure promotes a strongly adhesive deposition of subsequent layers, since an intimate permeation of the layers occurs in the border area. A deviation of individual crystals from an exact 90° position in the surface area is thereby definitely desirable, since corresponding irregularities lead to a better interlacing of the layers with one another.

Figure 4:
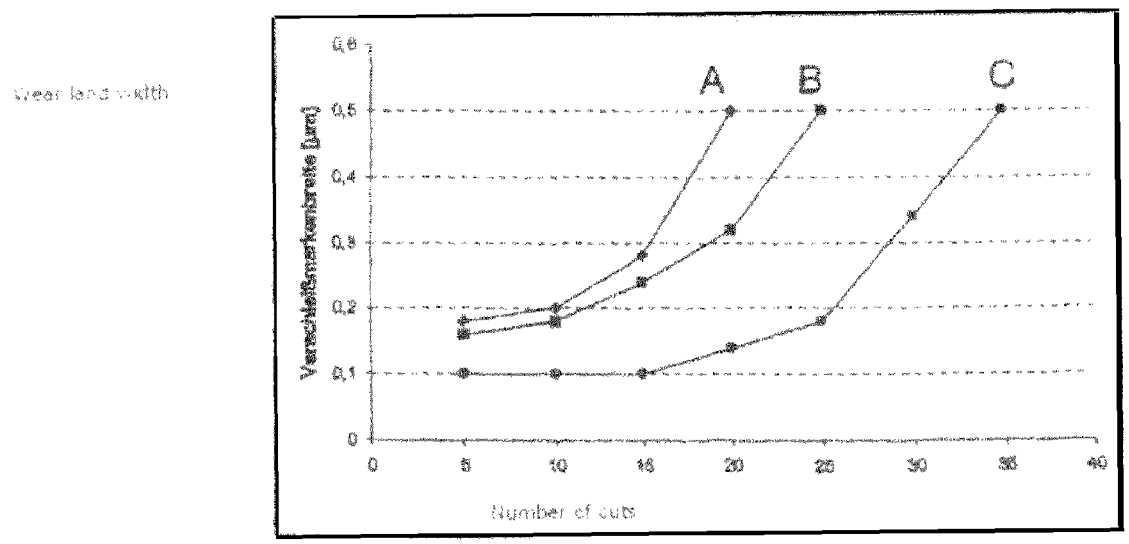
FIG. 4: A representation of a wear land width $v_b$, determined experimentally versus a number of cuts for indexable inserts with different coatings.

FIG. 4 shows data on wearing tests with indexable inserts that had multilayer CVD coatings with a structure according to Table 1. The hard metal substrate and the insert geometry were identical for all indexable inserts.

TABLE 1

Structure and layer thickness of multilayer coatings for inserts A through C

| Layer | Layer thickness [μm] | | |
|---|---|---|---|
| | A | B | C |
| TiN | 0.5 | 0.5 | 0.5 |
| MT-TiCN* | 10.0 | 3.0 | 3.0 |
| E-TiCN** | — | 4.0 | 7.0 |
| $Al_2O_3$ | 3.0 | 3.0 | 3.0 |
| TiN | 0.5 | 0.5 | 0.5 |
| Total | 14.0 | 11.0 | 14.0 |

*Medium-temperature titanium carbonitride
**Titanium carbonitride deposited according to the invention The indexable inserts were tested under the following test conditions with a rotary machining of the material:
Machined steel: 34 CrNiMo 6, 261 HB;
Cutting speed $v_c$: 280 m/min;
Cutting depth $a_p$: 1.50 mm;
Feed f: 0.28 mm/U; and
Stepped cut with emulsion, each cut 30 seconds.

As can be seen from FIG. 4, under the same operating conditions indexable inserts B and C have a much smaller wear land width compared to indexable insert A with the same connecting layer to the hard metal (0.5 μm TiN) and the same outer layer (0.5 μm TiN). After twenty cuts, a wear land width for indexable insert A is 0.50 μm, whereas for indexable insert B 0.32 μm and for indexable insert C 0.14 μm were determined. Comparing the layer thicknesses of indexable inserts B and A, it can be established that an increased wear resistance is achieved despite a smaller layer thickness. This indicates advantages in terms of production engineering, since approximately one hour per μm layer thickness must be allowed with a deposition by CVD processes. More wear-resistant coatings can now therefore be produced in a shorter time.

Further tests showed that a titanium carbonitride layer according to the invention can also be used advantageously as an outermost working layer. With otherwise the same layer structure and the same layer thickness, inserts with an outermost layer of titanium carbonitride according to the invention are superior in terms of service life by 1.5-fold or more as compared to inserts with medium-temperature titanium carbonitride as a working layer, even if the microhardness is lower. This effect is attributed to the special structure of titanium carbide layers produced according to the invention.

Figure 5:
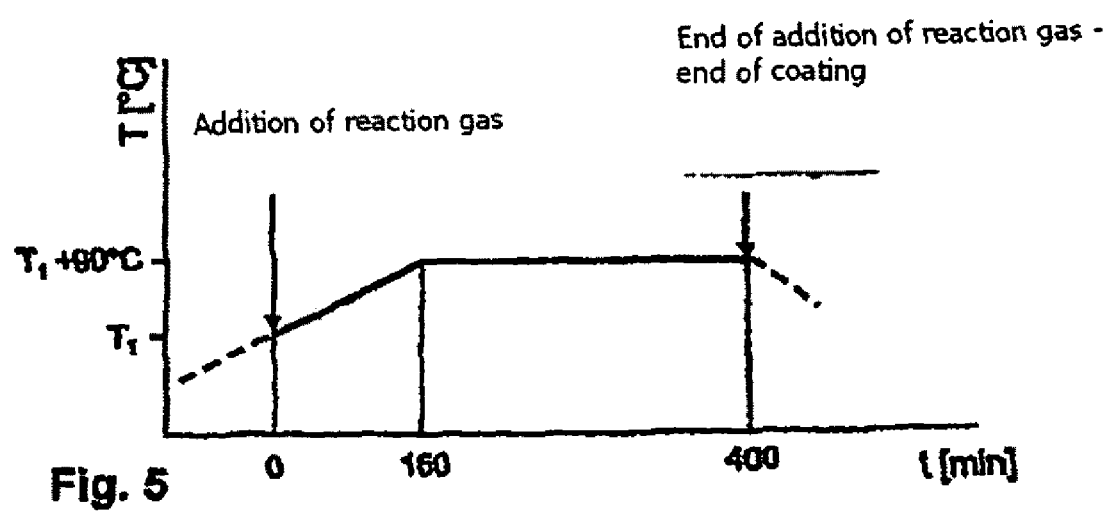
FIG. 5: A diagrammatic representation of the temperature variation during a coating.

FIG. 5 shows diagrammatically, and by way of example, a procedure with a coating according to the invention based on a time-temperature diagram. As shown in the time-temperature diagram of FIG. 5, at a temperature $T_1$ of the base structure or the reaction chamber of approximately 960° C. (time "0"), reaction gas containing methane, nitrogen, hydrogen in a ratio of 1:10:20 and 4% by volume titanium tetrachloride is added, whereby, rod-shaped titanium nitride nuclei are deposited. Subsequently, the temperature is consistently increased to 1050° C. within 150 minutes with constant contact with the reaction gas. However, the temperature increase from 960 to 1050° C. may also be carried out incrementally. Finally, the coating is continued for another 250 minutes at 1050° C. and with the same composition of the reaction gas and then ended.

The invention claimed is:

1. A coating for application to an object, the coating comprising:
at least one metal carbonitride layer composed of a metal of comprising at least one of titanium, zirconium, hafnium, vanadium, niobium, tantalum and chromium, wherein the metal carbonitride layer comprises a nanocomposite structure having crystals with inhomogeneous element distribution,
wherein the crystals have center and marginal areas and have different contents of carbon and of nitrogen in the center and in the marginal areas.

2. The coating of claim 1, wherein the at least one metal carbonitride layer comprises a titanium carbonitride layer.

3. The coating of claim 1, wherein the crystals comprise at least two types of crystals having different geometric formations.

4. The coating of claim 1, wherein the at least one metal carbonitride layer is formed from at least one type of crystal with star-shaped acicular structure and at least one type of crystal with lamellar structure.

5. The coating of claim 1, wherein the at least one metal carbonitride layer is doped with one of boron, silicon, zirconium, hafnium, vanadium or a rare earth element.

6. The coating of claim 1, wherein an average size of the crystals increases towards an outer workpiece side of the coating.

7. The coating of claim 1, wherein the crystals have an average size of less than 65 nm.

8. The coating of claim 7, wherein the crystals have an average size of less than 45 nm.

9. The coating of claim 1, wherein the at least one metal carbonitride layer has a composition $MeC_xN_y$,
wherein x is 0.1 to less than 0.3 and y is 0.9 to more than 0.7, and
wherein Me is representative of the metal.

10. The coating of claim 9, wherein the x is 0.15 to 0.20 and the y is 0.85 to 0.80.

11. The coating of claim 1, wherein a color of the at least one metal carbonitride layer is a yellowish-red shade having a light-dark structure.

12. The coating of claim 11, wherein the color is discernible at 500-1000× magnification in a micrograph from an optical microscope.

13. The coating of claim 11, wherein the light-dark structure comprises a vein structure.

14. A tool or tool part, comprising:
a base structure with one or more layers applied thereto, wherein at least one layer of the one or more layers comprises the coating of claim 1.

15. The tool or tool part of claim 14, wherein:
the coating is formed on an outer workpiece side of the tool or tool part, in a star-shaped acicular manner; and
the coating further comprises a top layer composed of an oxide layer or a carbon layer.

16. The tool or tool part of claim 14, wherein the oxide layer comprises an aluminum oxide layer ($Al_2O_3$) and the carbon layer comprises a diamond layer.

17. The tool or tool part of claim 14, wherein the tool or the tool part comprises an insert cutting element.

18. A method for coating a tool or tool part, comprising:
providing a base structure of the tool or the tool part at a temperature of 850° C. to 950° C.; and
applying at least one layer of one or more layers to the base structure, wherein the at least one layer comprises the coating of claim 1 and:
the one or more layers of the at least one layer is deposited by a deposition of a gas containing methane, nitrogen and at least one metal compound; and
after beginning the applying, the temperature is increased by at least 40° C. to an increased temperature and the deposition is continued for a time at the increased temperature.

19. The method of claim 18, wherein the tool or the tool part comprises a cutting element.

20. The method of claim 19, wherein the cutting element is an insert.

21. The method of claim 18, further comprising increasing the temperature of the base structure as the deposition progresses.

22. The method of claim 18, wherein the temperature is increased to the increased temperature within 350 minutes after beginning the deposition.

23. The method of claim 22, wherein the temperature is increased to the increased temperature within 120 minutes after beginning the deposition.

24. The method of claim 18, wherein the time is at least 60 minutes.

25. The method of claim 18, wherein the increased temperature is between 1010° C. to 1040° C.

26. The method of claim 18, wherein the at least one metal compound comprises titanium tetrachloride.

27. The method of claim 26, wherein the gas contains methane, nitrogen and hydrogen in a molar ratio of 1:8 to 11:15 to 25 and the gas contains 1% to 8% titanium tetrachloride by volume.

* * * * *